United States Patent [19]

Sharp et al.

[11] 4,021,653

[45] May 3, 1977

[54] DIGITAL PROGRAMMABLE TONE DETECTOR

[75] Inventors: Ronald Edward Sharp, Lauderhill; David Frank Willard, Plantation, both of Fla.

[73] Assignee: Motorola, Inc., Schaumburg, Ill.

[22] Filed: Oct. 14, 1975

[21] Appl. No.: 621,711

[52] U.S. Cl. .......................... 235/152; 235/151.31; 324/78 D; 324/79 D; 328/134; 328/138
[51] Int. Cl.² ................. G01R 23/02; G01R 23/14
[58] Field of Search ..................... 235/151.31, 152; 307/233 R, 295; 324/77 B, 78 D, 79 D; 328/134, 138, 140

[56] References Cited
UNITED STATES PATENTS

| | | | |
|---|---|---|---|
| 3,568,067 | 3/1971 | Williford | 328/134 X |
| 3,636,446 | 1/1972 | Genter et al. | 328/138 X |
| 3,701,012 | 10/1972 | Lang | 328/140 X |
| 3,764,924 | 10/1973 | Caplan et al. | 328/134 X |
| 3,812,432 | 5/1974 | Hanson | 328/138 |
| 3,820,021 | 6/1974 | Clarisse | 324/79 D X |

*Primary Examiner*—Jerry Smith
*Attorney, Agent, or Firm*—Patrick T. King; James P. Hamley; Donald B. Southard

[57] ABSTRACT

An improved detection arrangement for detecting the presence of a given tone in a received input signal. A reference generator, in the form of a reference clock and a programmable divider, produces a first reference frequency, equal to the frequency of the tone, and at an arbitrary phase angle thereto. A second generator output is in quadrature to the first. Each reference signal is product detected with the input signal via exclusive OR gates.

A unique digital low pass filter, operating in a time multiplex mode, receives the gate outputs, removes all high frequency components therefrom, and produces pairs of output binary number encoded signals, each of which is representative of a vector component of a detected tone. Threshold detector circuitry monitors the outputs indicating an above threshold condition at its output in response to predetermined combinations of the binary numbers. The combinations represent all input vectors whose resultant absolute magnitude exceeds a chosen threshold.

A second detector samples the threshold detector output, recording the number of samples over threshold during a given interval. If the number exceeds a selected minimum an output signal is produced which indicates the presence of a received tone.

26 Claims, 6 Drawing Figures

DIGITAL PROGRAMMABLE TONE DETECTOR

BACKGROUND OF THE INVENTION

This invention relates to tone detecting systems and, more particularly, to an improved programmable tone detector in digital form.

Tone detection arrangements of one sort or another are of course known in the art, as applied especially in radio wave communication systems. There, for example, each of a plurality of transceivers may be assigned its own distinct tone, or tone sequence code. Communication to an individual transceiver is accomplished by initially broadcasting the appropriate transceiver code. Tone detection circuitry within the transceiver responds by signalling that a broadcast to that transceiver is desired.

Tone detectors necessarily employ bandpass filters. If a plurality of code tones are located within a given frequency spectrum, the bandpass of each filter must be narrow enough to pass the selected tone. Moreover, the bandpass filter characteristics must be stable both as to temperature and time so as to assure proper operation of the communication system. Conventional tone detector filters include mechanical reed filters, programmable active filters, and more recently phase lock loop detectors.

A major disadvantage to all such prior art systems, however, is their need for discrete capacitors, resistors, and inductors. Not only do these discrete components consume precious space, but they also are subject to temperature effects and aging. Further, the handling of numerous discrete components increases manufacturing costs and reliability problems.

The development of large scale integration techniques, especially as applied to digital signal processing, has offered additional options to the circuit designer. Literally hundreds of active devices may be fabricated and interconnected on monolithic, macroscopic chips. Whereas, formerly, the digital equivalent of an analog circuit might encompass scores of discrete active devices, the above mentioned integration makes many of the digital counterparts increasingly more appealing. In addition, by time multiplexing techniques a single digital circuit can process a plurality of signal lines, thus avoiding circuit duplication. Further, digital designs can achieve a higher precision, and maintain the precision over wider temperature ranges and time intervals, than analog circuits. Moreover, by using digital signal processing the designer can drastically reduce, or eliminate, the need for external discrete components, thus realizing savings in cost and space.

SUMMARY OF THE INVENTION

It is an object of the invention, therefore, to provide an improved tone detector arrangement which is more precise in operation and whose characteristics are more stable with temperature variation and age.

It is a further object of the invention to provide the arrangement as described above which is small in size yet relatively inexpensive to manufacture.

A further object of the invention is to provide the arrangement described in the two preceding paragraphs using multiplexed digital circuitry.

Briefly, according to the invention, an improved tone detector arrangement detects the presence of a tone at some given frequency in an incoming signal. The detector arrangement comprises a generator, having first and second outputs, which produces at its first output a signal at the reference frequency, and at its second output a signal at the same frequency but at a predetermined phase reference to the first signal. Preferably, the second output is in quadrature to the first. Each reference signal is mixed with the input signal.

A time multiplexed digital low pass filter receives the mixer outputs removing all high frequency components. The resulting filter outputs are binary number signals, each of which is representative of a vector magnitude of the amplitude of an input tone. The binary signals are passed to processing circuitry which has been preprogrammed to produce a first logic state output in response to combinations of binary signals which represent a resultant tone amplitude vector above a minimum threshold level.

Further detection circuitry includes means to sample the output of the first detector, recording the number of samples over threshold in a given interval, and producing an activated output in response to an interval count exceeding a selected minimum.

DETAILED DESCRIPTION OF A PREFERRED EMBODIMENT OF THE INVENTION

Figure 1:
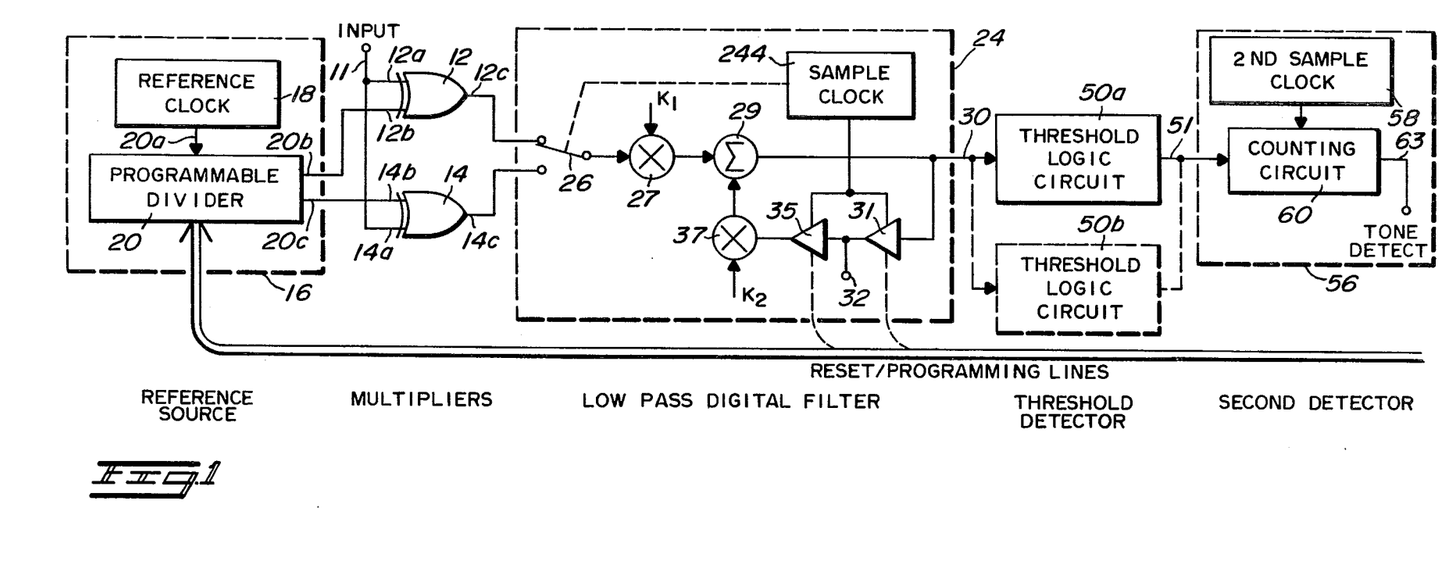
FIG. 1 is a block diagram of the tone detector arrangement constructed in accordance with the present invention.

Referring now to the drawings, and more specifically to FIG. 1, an input wave form, to be detected for the presence of a tone of frequency $f$, is fed via line 11 to first and second mixers 12, 14. Each mixer may be formed by an exclusive OR gate having first inputs 12a, 14a, second inputs 12b, 14b, and outputs 12c, 14c, respectively. Each mixer second input connects to an output of a reference signal source 16 formed by a stable clock oscillator 18 and a programmable divider 20, which is more fully described with reference to FIG. 2. Programmable divider 20 frequency divides signals at its input 20a producing a first output 20b and a second output 20c which is in quadrature with the first. The clock 18 is frequency divided by divider 20 whereby it produces a first output 20b at frequency $f$ with an arbitrary phase angel $\theta$ with respect to the input waveform, and a second output 20c at reference frequency $f$ and at a phase angle $\theta \pm 90°$. The first output 20b feeds the second input 12b of gate 12 and the second output 20c feeds the second input 14b of mixer 14.

The resultant output from mixer 12 is of the form $A(t) \sin \theta$ plus higher frequency terms, where $A(t)$ represents the absolute magnitude of a tone on the input wave form at frequency $f$. Similarly, the output from the second mixer 14 is of the form $A(t) \cos \theta$ plus higher frequency terms. These higher frequency terms are filtered off by the low pass digital filter 24 which, via switch 26, multiplexes the two mixer outputs so that the same filter 24 provides a low pass for each mixer output. Inputs to filter 24 are first multiplied by a constant K1 in multiplier 27, and thereafter passed to summer 29. The summer output feeds to the filter output 30, and also to the input of a delay network 31. The output from delay network 31 couples to the input of a second delay network 35 whose output couples to a second multiplier 37. A sample clock 244 activates switch 26 and advances signals through the delay networks 31, 35. Multiplier 37 multiplies signals by a second constant K2, applying the resultant to the summer 29. The low pass digital filter 24 is described more fully hereinafter with reference to FIG. 3.

With the higher frequency components removed, the filter output 30 produces a binary signal representative of the $A(t) \sin \theta$ function, and at the following clock pulse, output 30 produces a binary signal representative of the $A(t) \cos \theta$ function. Each of these binary encoded signals represents a distinct vector component of the absolute value of the amplitude of an input tone at the reference frequency $f$. In conventional circuitry the signals would there be squared, added, and the square root taken whereby the resultant amplitude vector of the input tone would be derived. In the instant invention, however, the binary number signal outputs from the low pass digital filter 24 are sequentially fed to a logic circuit 50a, which has been designed to produce an activated output 51 for those combinations of input signals representative of a resultant tone amplitude above a selected threshold. A second threshold circuit 50b is shown in dotted lines since it is not essential to the proper functioning of the invention, but provides versatility. It is a particular feature of the invention that any one of several threshold levels can be selected merely by switching in the appropriate threshold detector. Thus, it should be understood that a device according to the invention might utilize one, or a plurality of threshold detectors.

To further insure the proper detection of an input tone, threshold logic output 51 couples to the input of a second detector 56. Second detector 56 is comprised of a sample clock 58 which couples to one input of counting circuit 60, whose second input couples to the second detector input. The counting circuit updates its count to correspond with the number of samples over threshold occurring within a specified period of time prior to each new sample. Should the counter count "up" to a predetermined value, internal circuitry activates the counter output 63 which indicates that a tone is present. Thus the second detector 56 gives further assurance that the proper tone signal does in fact exist within the input waveform by reducing the probability tht short bursts of interference are mistaken as the expected tones.

Figures 2, 5:
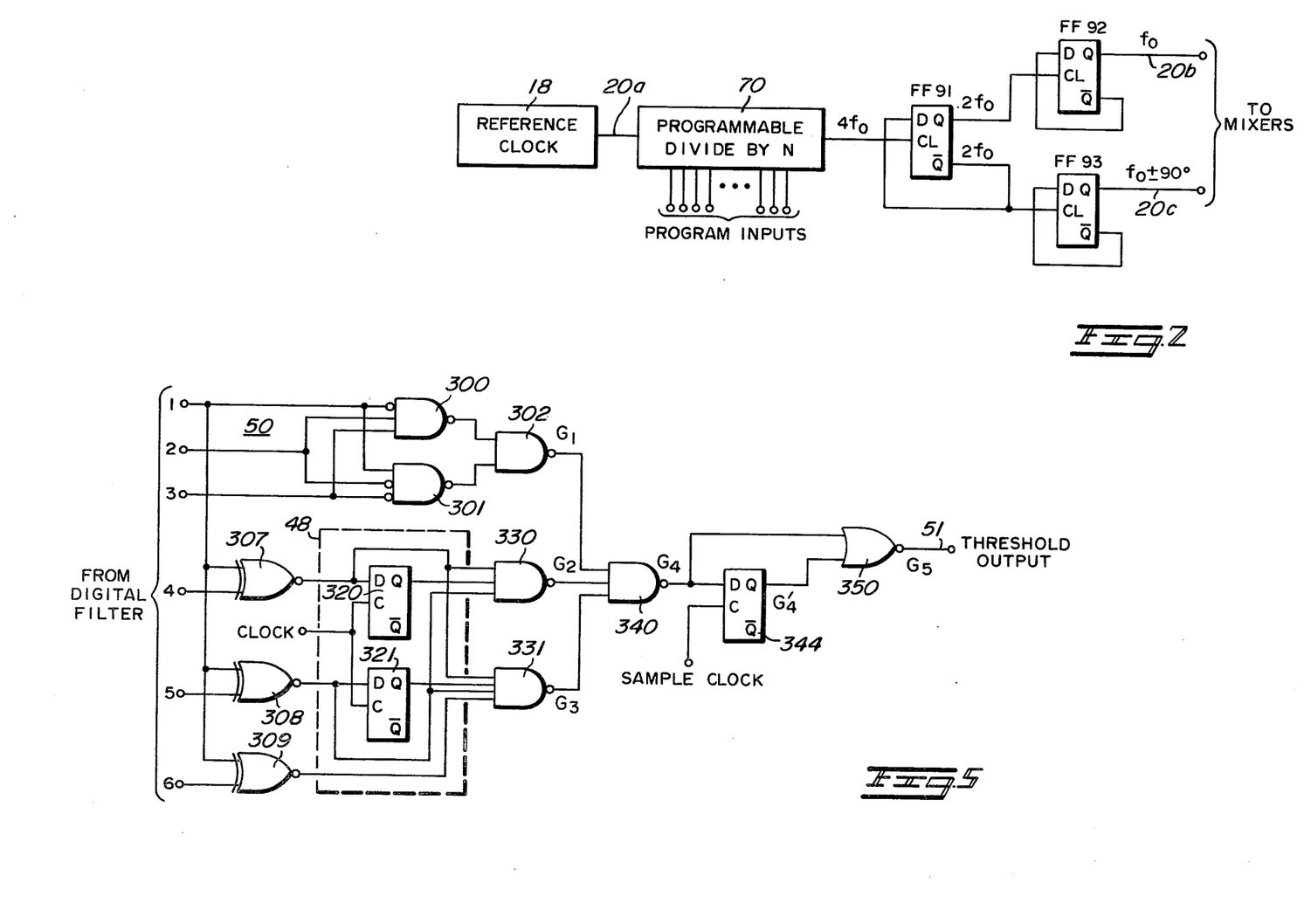
FIG. 2 is a logic diagram of the programmable frequency divider forming a part of the tone detector of FIG. 1.
FIG. 5 illustrates a more specific aspect of the threshold detector.

FIG. 2 is a more detailed diagrammatic representation of the programmable divider associated with the reference source 16 (as shown in FIG. 1). Reference clock pulses are fed through line 20a to the input of a programmable frequency divider 70 such as the MC 14526 or any of a number of off-the-shelf integrated circuits designed for this purpose. The program inputs are chosen such that the divisor N is equal to the reference clock frequency divided by 4 times the desired frequency to be detected (4fo). The 4fo output is fed to the clock input of FF91. The Q output of FF91 is fed back to the D input of FF91 resulting in a divide by 2 circuit. The resultant Q and $\bar{Q}$ outputs of FF91 are 50% duty cycle square waves at a frequency equal to 2fo. FF93 and FF92 have their $\bar{Q}$ outputs connected to their respective D inputs also forming divide by two circuits. The Q output of FF91 is fed to the clock input of FF92 resulting in the Q output at frequency fo. In a like manner the $\bar{Q}$ output of FF91 is fed to the clock input of FF93 resulting in the Q output equal to the frequency fo but ± 90° in phase relative to the Q output of FF92.

The reference signals are fed to exclusive OR gates, 12, 14 of FIG. 1, as is the input waveform signal. The gates 12, 14 generate a 0 binary output responsive to the synchronous occurrence of an input signal and a reference signal, and a 1 binary output responsive to nonsynchronism therebetween. Multiplex switch 26 operates at a predetermined sampling rate to selectively pass the exclusive OR outputs 12c, 14c to the digital filter.

The function of the filter 24 is to strip the higher frequency undesired signals from the product detected output of the multipliers and to generate output signals in binary number form. In the present application, the required filter characteristic is a first order roll-off having a 3 db point at about 7.5 Hz. The implementation of this filter, including time multiplexing means whereby a single filter may be used for both mixer outputs, is discussed hereinbelow.

The differential equation describing the output of an RC low pass network being driven by an input time varying signal is:

$$\frac{dV_c(t)}{dt} = -\frac{1}{RC} V_c(t) + \frac{1}{RC} V_i(t) \qquad (1)$$

where $V_i$ (T) is the input driving signal, $V_c$(T) is the resultant filter signal, and $R$ and $C$ are the values of resistance and capacitance in the filter. The forced response of this network is:

$$V_c(t) = \int_{-\infty}^{t} \mathrm{EXP}\left[-\frac{1}{RC}(t-\tau)\right] \cdot \frac{1}{RC} V_i(\tau) d\tau \qquad (2)$$

where $\tau$ is the variable of integration. The continuous response of (2) may be approximated by the series:

$$V_c(kT) = \frac{1}{RC} T \sum_{i=-\infty}^{k} \mathrm{EXP}\left(-\frac{1}{RC}\left[(k-i)T\right]\right) V_i(iT) \qquad (3)$$

in which the continuous variable $t$ has been replaced by a discrete time variable kT, where T represents the period between sampling of the continuous function of (2). Taking the Z transform of (3) yields:

$$V_c(Z) = \frac{1}{RC} T \frac{1}{1-\mathrm{EXP}\left(-\frac{1}{RC} T\right)Z^{-1}} V_i(Z) \qquad (4)$$

where Z equals $e^{sT}$.

Rearranging equation (4) yields:

$$V_c(Z) = \mathrm{EXP}\left[-\frac{1}{RC} T\right] Z^{-1} V_c(Z) + \frac{1}{RC} T V_i(Z) \qquad (5)$$

Inverting back to the time domain:

$$V_c(kT) = K_2 V_c[(k-1)T] + K_1 V_i(kT) \qquad (6)$$

where $K_2$ equals $$K_2 = \mathrm{EXP}\left(-\frac{1}{RC}T\right)$$

and $K_1$ equals $$K_1 = \frac{1}{RC}T$$

A digital implementation, of the recursive type, for equation (6) is illustrated within block 24 of FIG. 1. Added to the filter is a second time delay 31 which allows the filter to be time multiplexed. Since the filter input consists of only two states i.e., either 1 or 0, multiplier 27 may be reduced to a simple decision to present either 0 or the filter constant $K_1$, to the summer 29 input. An efficient realization of the second multiplier 37 is significantly more problematical. Constant $K_2$ is seen to be approximately equal to, but slightly less than unity. Thus:

$$K_2 = \mathrm{EXP}\left[-\frac{1}{RC}T\right] = 1 - A \qquad (7)$$

where $A$ is a small number. For convenience the sampling time, $T$, is chosen such that the binary representation of $A$ is of the form:

$$A_2 = 2^{-n} \qquad (8)$$

where $A_2$ is the binary representation of $A$. The output of the second multiplier 37, $M(kT)$, can be expressed as:

$$M(kT) = K_2 V_c[(k-1)T] \qquad (9)$$

Substituting for $K_2$, and rearranging yields:

$$M(kT) = V_c[(k-1)T] - A\, V_c[(k-1)T] \qquad (10)$$

As a result of the choice of A, multiplying by A is equivalent to "shifting" the binary point of $V_c[(k-1)T]$ $n$ places to the left (analogous to multiplying by a power of 10 in decimal arithmetic). Thus defining:

$$V_s[(k-1)T] = A \cdot V_c[(k-1)T] \qquad (11)$$

to be equal to a shifted version of $V_c[(k-1)T]$. Now:

$$M(kT) = V_c[(k-1)T] - V_s[(k-1)T] \qquad (12)$$

While equation (12) could be implemented directly, a subtractor would be required, which is added hardware. Since the filter is to have unity gain, $V_c(kT)$ is restricted to the interval (0,1.0). With this in mind, $V_c$ can be written in terms of its complement, resulting in:

$$M(kT) = 1 - \overline{V_c}[(k-1)T] - V_s[(k-1)T] \qquad (13)$$

where $\overline{V_c}$ is the complement of $V_c$.

Factoring and complementing again results in:

$$M(kT) = \overline{\overline{V_c}[(k-1)T] + V_s[(k-1)T]} \qquad (14)$$

Notice that a realization of equation (14) requires no subtractor. Further, the function of the second multiplier 37 has been reduced to a simple "shift and add" routine. Choosing a sample rate of $f_s$ (i.e. $1/T$) equal to 12.028 samples/second leads to an $A_2$ of $2^{-8}$ for the 7.5 Hz filter design. Computer simulations indicate that with this sampling rate, a 15 bit representation approximates the analog response without too much error. Experimentally, a 12 representation was found to be acceptable.

Figure 3:
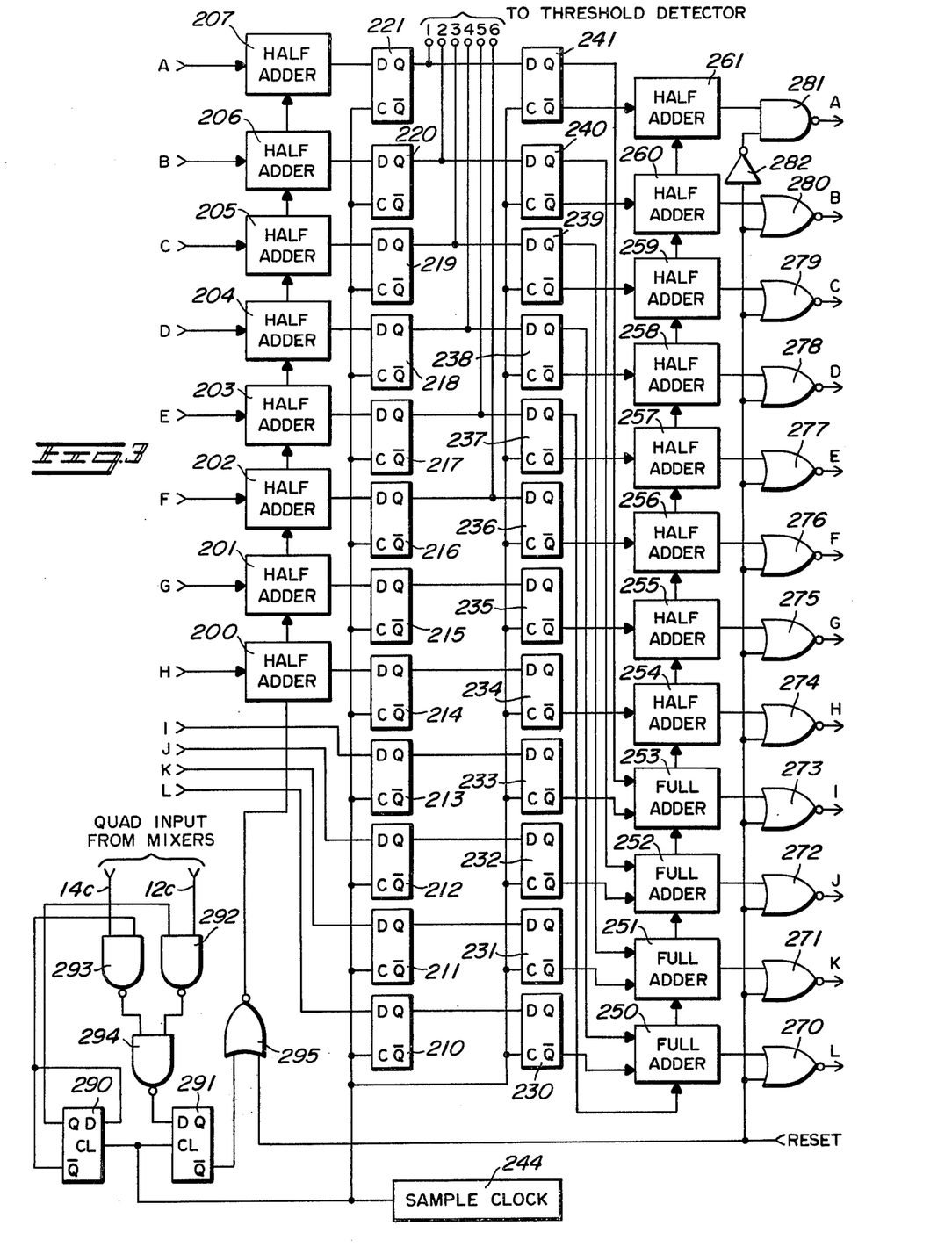
FIG. 3 is a further logic diagram of the digital low pass filter also forming a part of the tone detector of FIG. 1.

The resultant digital filter design is illustrated fully in FIG. 3. The quadrature outputs from the exclusive OR mixers 12 and 14 are fed to NAND gates 292 and 293 respectively along with the Q and $\overline{Q}$ outputs of FF290. FF290 has its D input connected to its $\overline{Q}$ output resulting in the sample clock signal present at the clock input appearing at the Q of $\overline{Q}$ outputs one-half the sample clock frequency. Outputs from NAND gates 292 and 293 are fed to NAND gate 294 with the output of NAND gate 294 fed to the D input of FF291. NAND gate output 292 is equal to input 12c when Q of FF290 is in the 1 state and is equal to input 14c when $\overline{Q}$ of FF290 is in the 1 state, thus it represents alternate samples of the two signal input lines. The sample clock is connected to the clock input of FF291. The $\overline{Q}$ output of FF291 is fed to NOR gate 295 along with the filter reset line. The output from NOR gate 295 is applied to the input of the first of eight half adders 200–207. The carry output of each half adder feeds to the input of a subsequent half adder. Each half adder output connects to the D input of 8 out of 12 D type flip flops 210–221. The Q output of each first array 210–221 flip flop grouping couples to a corresponding one of the D inputs in a second flip flop grouping 230–241. The "clock" input of both flip flop groupings 210–221 and 230–241 is fed from a sample clock 244 which also controls the data sampling circuitry.

The Q output of the first four, second array, flip flops 230–233 feeds to one input of corresponding full adders 250–253. The remaining second array flip flops 234–241 Q outputs feed to the inputs of corresponding half adders 254–261. Each Q output of flip flops 237–241 feeds to a corresponding second input of the full adders 250–253. Further, the carry output of each full and half adder 250–253, 254–261 feeds to carry input of a subsequent adder. The adder's outputs are passed through corresponding NOR gates 270–280 and NAND gate 281, with the output of NOR gates 270–273 fed back to the D inputs of first array flip flops 210–213. Similarly, the outputs of NOR gates 274–280 and NAND gate 281 are fed back to the corresponding half adder 200–207 inputs. Thus, in the drawing each output A–L connects to a corresponding input A–L. The reset line connects to the other inputs of NOR gates 270–280 and to inverter 282 which is connected to NAND gate 281. The reset condition results in output A equal to state 1 and B–L equal to state 0.

Comparing FIG. 3 with FIG. 1, half adders 200–207 represent the summer 29, first array flops 210–221 represent the first time delay 31, second array flip flops 230–241 correspond to the second time delay 35, selected outputs from the second array flip flops 230–241 couple to full adders 250–253, and half adders 254–261, along with NOR gates 270–280 and NAND gate 281 corresponding to the second multiplier 37 and FF290–291 and NAND gates 292–294 represent the multiplex switch 26. It was found that adequate filter processing required outputing only 6 of the 12 bits. These outputs, numbered 1–6 in the drawing, are seen taken from the Q outputs of first array flip flips 216–221, where they are fed to the threshold detector described more fully in FIG. 5.

In summary, the digital output from one multiplier is processed and stored in the first time delay 31, corresponding to flip flops 210–221. In a subsequent sampling time, the information stored in delay 31 is passed to delay 35, corresponding to second array flip 230–241. In the third subsequent sampling time, the information stored in delay 35 is processed through multiplier 37, (which as indicated above is here implemented by a shift and add routine), with the resultant summed in summer 29 along with clocked samples from the first multiplier. Thus, it is seen that using two delays 31, 35 allows low pass time multiplexing of both multiplier outputs. The resultant filter output is a 6 bit binary number, which is representative of vector components of the absolute magnitude of an input tone at frequency $f$.

The possible digital filter outputs are:

TABLE A

| | | | FILTER OUTPUT | | | | |
|---|---|---|---|---|---|---|---|
| | 1 | 2 | 3 | 4 | 5 | 6 | |
| Above Thres- hold | 1 | 1 | 1 | 1 | 1 | 1 | |
| | 1 | 1 | 0 | x | x | x | |
| | 1 | 0 | 1 | 0 | 0 | 0 | |
| | 1 | 0 | 0 | 1 | 1 | 1 | |
| | 1 | 0 | 0 | 1 | 1 | 0 | |
| | 1 | 0 | 0 | 1 | 0 | 1 | |
| | 1 | 0 | 0 | 1 | 0 | 0 | |
| | 1 | 0 | 0 | 0 | 1 | 1 | |
| | 1 | 0 | 0 | 0 | 1 | 0 | |
| | 1 | 0 | 0 | 0 | 0 | 1 | |
| Reset | 1 | 0 | 0 | 0 | 0 | 0 | Indeterminant area resolved by threshold logic |
| | 0 | 1 | 1 | 1 | 1 | 1 | |
| | 0 | 1 | 1 | 1 | 1 | 0 | |
| | 0 | 1 | 1 | 1 | 0 | 1 | |
| | 0 | 1 | 1 | 1 | 0 | 0 | |
| | 0 | 1 | 1 | 0 | 1 | 1 | |
| | 0 | 1 | 1 | 0 | 1 | 0 | |
| | 0 | 1 | 1 | 0 | 0 | 1 | |
| | 0 | 1 | 1 | 0 | 0 | 0 | |
| Above Thres- hold | 0 | 1 | 0 | 1 | 1 | 1 | |
| | 0 | 0 | 1 | x | x | x | |
| | 0 | 0 | 0 | 0 | 0 | 0 | |

By setting the filter output to have an initial value of one half, i.e., 0.100000, the desired threshold is then some increment above one half for positive going outputs and the same increment below one half for negative going outputs. In many signalling applications the ratio of this increment to the maximum output referenced to the no signal output is in the area of one fourth (overdrive defined to be 20 log ¼ equals 12db). Thus equation:

$$\Delta V_{threshold} = \frac{1}{4} \Delta V_{max} = \frac{1}{4} \frac{1}{(2)} = \frac{1}{8} \quad (16)$$

whereby:

$$V_{threshold} = \frac{1}{2} + \frac{1}{8}, \frac{1}{2} - \frac{1}{8} \quad (17)$$

$$= \frac{5}{8}, \frac{3}{8}$$

$$= .010000000000, .010111111111$$

By examining only the 6 most significant bits of the filter output, overdrive can be specified within 1db. Thus, if either multiplier output equals or exceeds 0.101000 or is less than or equal to 0.0101110 the system is over threshold independent of the filtered output of the other multiplier. For a binary number signal between 0.011000 and 0.1000111 the system may or may not be over threshold. For this case both filtered multiplier outputs must be compared in combination. In concept, the algorithm to be implemented is:

$$\sqrt{(\Delta V_{o1})^2 + (\Delta V_{o2})^2} \geq \frac{1}{8} \quad \text{implies system over threshold} \quad (18)$$

where $\Delta V_{o1}$ represents the filtered output of the first multiplier and $V_{o2}$ represent the filtered output of the second multiplier.

Figure 4:
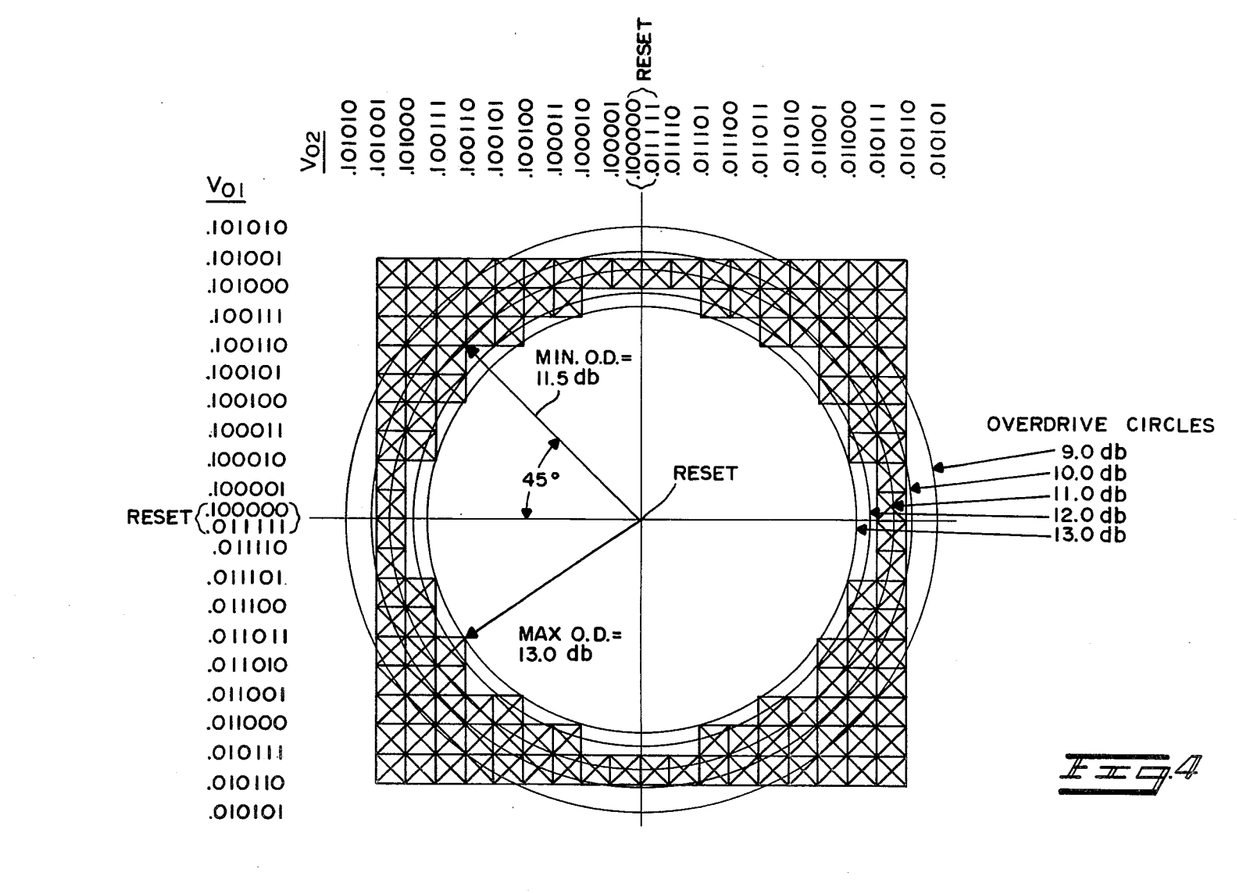
FIG. 4 is a map which is used as a design aid for the threshold detector arrangement.

All possible combinations of $V_{o1}$ and $V_{o2}$ have been mapped in FIG. 4. By superimposing circles of constant overdrive, those combinations of possible inputs Vo1, Vo2 having a given overdrive condition may be distinguished. Thus, the figure shows as X's those combinations representative of an overdrive less than 12 db. It should be apparent that if a system using a greater number of bits were employed, the inner area would more closely approximate a circle. A vector indicting a minimum overdrive of 11.5db, and another vector indicating a maximum overdrive of 13 db are shown for this stepwise approximation. Conceptually, the resultant vector emanating from the reset position, at the center of the map, extends at a magnitude equal to the absolute magnitude of an input detected tone, and at an angle representative of the phase between the input tone and the reference generator.

A circuit implementing the map of FIG. 4 is illustrated in FIG. 5. The three most significant bits from the filter feed to a triplet of interconnected NAND gates 300–302 which produce the logic output $G_1$. The first significant binary input, 1, also feeds one input of a trio of exclusive OR gates 307–309, each of whose first input is fed from a corresponding one of the remaining filter significant bit inputs (4–6). Each exclusive OR 307–309 output couples to one of the inputs of the storage circuitry 48. Storage circuitry 48 contains a pair of D type flip flops, 320, 321 which are interconnected with a pair of NAND gates 330, 331. The storage outputs are taken through the NAND gates 330, 331 and are indicated as $G_2$ and $G_3$. Outputs $G_1$, $G_2$, and $G_3$ feed to the inputs of a final NAND gate 340, whose logic output, represented as $G_4$, feeds first to the D input of a D flip flop 344, and second to one input of an output NOR gate 350. The Q output of flip flop 344 connects to the second NOR gate 350 input whereby the NOR gate produces a logic output indicated as $G_5$. The sample clock 244, operating in synchronism to the multiplex sampling switch 26 (FIG. 1) drives the clock inputs of the three flip flops 320, 321 and 344.

Referring to truth table A, if the first three significant digits of either filtered output is other than 100, or 011, an above threshold condition exists. The NAND gate triplet 300–302 implement this condition, whereby $G_1$ is equal to 0 for all values of inputs 1, 2, 3 except 100 and 011. For G1 equal to 0, G4 equals 1 independent of inputs G2 and G3. Flip flop 344 allows the previous value of G4, G4', and the present value of G4 to be gated such that if either is above threshold the output G5 activates to the 0 state, indicating an above threshold condition.

If inputs 1, 2, 3 equal 100 or 011 further processing is required to determine the existence of threshold. To simplify this operation it is noted that the binary outputs in table 15 are symmetric about one half, i.e. they are bit by bit inverses. Thus, if the most significant digit input, namely the one input, is equal to 0 then all bits are inverted via the exclusive NOR triple 307–309.

In operation, during a first sampling period an input binary number signal is processed and stored in storage 48. This stored value is compared with the binary signal from the filter during a subsequent sample time, whereby either the G2, or G3 outputs activates to the logic 0 state should the inputs satisfy the overthreshold condition. For a below threshold condition, both G2 and G3 assume logic 1 states.

Thus, it is seen that the NAND gate triplet 301–302 in combination with the exclusive NOR triple 307–309, and NAND gates 330, 331, and 340 all act as a threshold level detector programmed to produce a predetermined logic output state in response to given sequences of input states. Using the storage facility 48, circuit duplication is avoided along with a reduction of input connections from 12 connections to 6.

Figure 6:
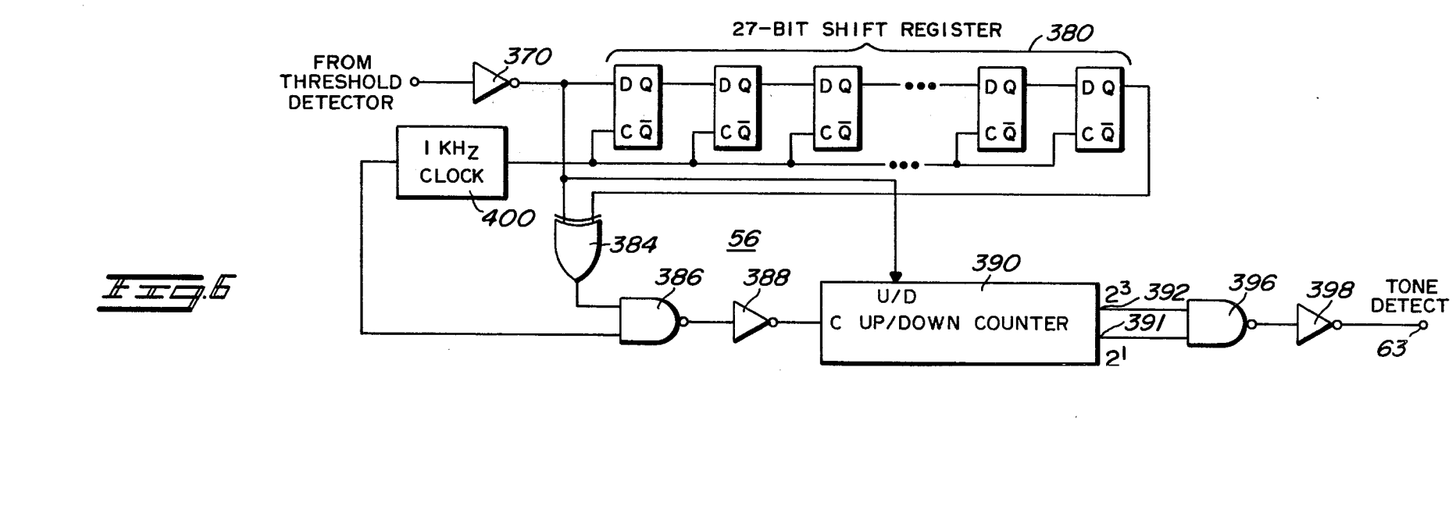
FIG. 6 illustrates still another aspect of the second detector.

Further verification of tone presence is provided by second detector 56, which is more fully discussed with reference to FIG. 6. An inverter 370 inverts the threshold detector output, whereby an inverter output in the 1 state corresponds to a detected tone. This output feeds to a 27 bit shift register 380 which is comprised of 27 interconnected D type flip flops. The shift register 380 output feeds to one input of an exclusive OR gate 384, whose remaining input couples first to the shift register 380 input and second to the up-down input of an up-down counter 390. The output feeds to one input of a NAND gate 386 whose output is inverted by inverter 388 and fed to the clock input of up-down counter 390. Up-down counter 390 has a first output 391, representative of the $2^1$ binary place, and a second output 392 representative of the $2^3$ binary place. Both these outputs 391, 392 feed to the inputs of a NAND gate 396 whose output is inverted by inverter 398 which connects to the tone detect output line 63.

A 1 Kz second sample clock 400, feeding to the clock input of each flip flop in the shift register 380, and to the second input of NAND gate 386, samples the output of the threshold detector once per millisecond. The result of each sample is then placed in the shift register 380, which is also clocked at the one millisecond rate. The register initially contains all logic 0's. At each sample time, the register's input and output are compared via exclusive OR 384, and NAND gate 386 with its associated inverter 388. If a logic 1 is inputed to the register, and a logic 0 is outputed, the counter "ups" one count. If the input and output are the same, the count remains unchanged. Finally, if a logic 0 is inputed and a logic 1 is outputed the counter "downs" one count. As a result of this procedure, at any point in time the output of the up-down counter indicates the number of 1's in the shift register. When the counter reaches a count of ten, i.e. activating both outputs 391 and 392, NAND gate 396 is satisfied and, through inverter 398, tone detect output 63 is activated.

A 27 stage shift register 380 is a logical choice for this application since the tones to be detected are 33 millisecond bursts, and it takes at least 6 milliseconds for the filter to reach threshold under strong signal conditions.

Since the entire tone detector system requires no capacitors, inductors, or resistors, it may be entirely implemented in monolithic integrated circuit form. Moreover, its digital design results in precision operation, with minimal variation due to aging or temperature effects.

While a preferred embodiment of the invention has been disclosed, it should be understood that many modifications and variations thereto are possible, all of which fall within the true spirit and scope of the invention.

We claim:

1. An improved digital detector arrangement for detecting the presence of a tone of a given frequency $f$ comprising in combination:
   reference signal generating means having first and second outputs, the first output producing a signal of frequency $f$ at a first phase reference, the second output producing a signal of frequency $f$ at a second phase reference predeterminedly related to the first phase reference;
   a first mixer means for mixing the input signal with the reference generator first output;
   a second mixer means for mixing the input signal with the reference generator second output;
   means times multiplexing the first and second mixer outputs through a digital low pass filter, said filter producing first and second digital outputs, each digital output representative of a vector component of the amplitude of the input tone; and
   processing means for processing the filter digital outputs and producing a tone detect signal in response to the presence of predetermined first and second vector components, the processing means including means for determining the resultant vector of said first and second vector components and further comprising means for generating said tone detect signal in response to the amplitude of said resultant vector exceeding a given threshold level.

2. The arrangement of claim 1 wherein the first and second mixers produce binary output signals and wherein the digital filter comprises
   summer means for summing a pair of binary signals received at its first and second inputs and providing the resultant at its output,
   first multiplier means for multiplying the first and second mixer produced binary signals by a first predetermined binary constant and passing the resultant signal to the first input of the summer,
   delay means for producing at its output a predetermined time delay of signals at its inputs,
   means coupling the summer output to the delay input, and
   second multiplier means for multiplying the output from the time delay means by a second predetermined binary constant and passing the resultant signal to the second input of the summer,
   whereby the output from the summer is a binary number signal representative of a low pass transfer of the binary signals from the first and second mixers.

3. The arrangement of claim 2 wherein the digital filter further comprises
   a first grouping of half adders providing both the summing and the first multiplier functions, a flip flop array providing the time delay function, and a second grouping of full and half adders, along with corresponding logic gates, providing the second multiplier function.

4. The arrangement of claim 2 wherein the multiplexing means comprises a multiplex switch operable at a predetermined rate to selectively couple the output from the first or second mixer to the digital filter first multiplier, and second time delay means comprising a flip flop register, said second time delay means having an input coupled to the digital filter time delay means output and an output coupled to the digital filter second multiplier input.

5. The arrangement of claim 4 wherein the time delay of each delay means is equal to one-half the period of the multiplex switch and is operably synchronous thereto.

6. The arrangement of claim 1 wherein the filter first and second outputs comprise a pair of binary signals and wherein the processing means comprises a threshold logic circuit means for processing said binary signals, the outputs of which logic circuit assumes a first logic level in response to predetermined combinations of said binary signals, the output otherwise assuming a second logic state.

7. The arrangement of claim 6 wherein the processing means further comprises means accepting the first and second time multiplexed filter outputs, storing said first filter output signal, and applying said stored signal to the threshold logic circuit together with the second filter output binary signal.

8. The arrangement of claim 1 wherein the reference generator further comprises clock means and a programmable divider means, the clock producing a stable reference frequency signal, and the divider dividing the clock output by a modulus N, the modulus N programmable in a determined manner in response to a selected frequency f whereby the clock signal is divided to the frequency f at first and second outputs, the second output in predetermined phase relationship with the first.

9. The arrangement of claim 1 wherein the reference generator produces the second signal in quadrature with the first.

10. The arrangement of claim 1 wherein each mixing means comprises logic means generating a first binary output responsive to the synchronous occurrence of an input signal and a reference signal, and a second binary output responsive to nonsynchronism thereof.

11. The arrangement of claim 1 further comprising means counting the number of above threshold samples detected during a predetermined time period, including means producing a second tone detect signal in response to a predetermined count.

12. The arrangement of claim 1 further comprising a plurality of counting means, each such means counting the number of above threshold samples detected during a predetermined time period, including means producing a second tone detect signal in response to a predetermined count.

13. The arrangement of claim 1 wherein the processing means comprises a plurality of threshold detecting means, each detecting means producing a threshold detect signal in response to predetermined first and second vector components, the arrangement further comprising means to selectively activate one of the desired threshold derectors.

14. A digital detector which detects the presence of a tone of a given frequency f in an incoming signal, having a reference signal generating means having a first and a second output, the first output producing a signal of frequency f at a first phase reference, the second output producing a signal having a second phase reference in quadrature with the first phase reference;

a first mixer for multiplying the reference signal generator first output and the input signal, a second mixer multiplying the reference signal generator second output and the input signal, the improvement comprising:

a digital low pass filter means for processing the first and second mixer outputs, said filter means producing first and second digital outputs, each digital output representative of a vector component of the amplitude of the input tone; and processing means for producing the filter digital outputs and producing a tone detect signal in response to the presence of predetermined first and second vector components, the processing means including means for determining the resultant vector of said first and second vector components and further comprising means for generating said tone detect signal in response to the amplitude of said resultant vector exceeding a given threshold level.

15. The improvement of claim 14 wherein the first and second mixers produce binary output signals and wherein the digital low pass filter comprises:

summer means for summing received binary signals at its first and second inputs and providing the resultant at its output, first multiplier means for multiplying said mixer binary output signals by a first predetermined binary constant and passing the resultant signal to the first input of the summer, means for producing at its output a predetermined time delay of signals at its inputs, means coupling the summer output to the delay input, and second multiplier means for multiplying the output from the time delay means by a second predetermined binary constant and passing the resultant signal to the second input of the summer, whereby the output from the summer is a binary number signal representative of a low pass transfer of the binary input signals.

16. The improvement of claim 15 wherein the digital low pass filter further comprises:

a first grouping of half adders providing both the summing and the first multiplier functions, a flip flop array providing the time delay function, and a second grouping of full and half adders, along with corresponding logic gates, providing the second multiplier function.

17. The improvement of claim 15 wherein the processing means includes multiplexing means comprising:

a multiplex switch operable at a predetermined rate to selectively couple the output from the first or second mixer to the digital filter first multiplier, and second time delay means having its input coupled to the digital filter time delay means output and its output coupled to the digital filter second multiplier input.

18. The improvement of claim 17 wherein the time delay of each delay means is equal to one-half the period of the miltiplex switch and is operably synchronous thereto.

19. The improvement of claim 14 wherein the filter first and second outputs comprise a pair of binary signals and wherein the processing means comprises a threshold logic circuit means for processing said binary signals, the output of which logic circuit assumes a first logic level in response to predetermined combinations of said binary signals, the output otherwise assuming a second logic state.

20. The improvement of claim 19 further comprising:

means for time multiplexing the first and second mixer output through the digital low pass filter; and the processing means further comprising means accepting the first and second time multiplexed filter outputs, storing said first filter output signal, and applying said stored signal to the threshold logic circuit together with said second filter output binary signal.

21. The improvement of claim 14 wherein the reference generator further comprises:

clock means and a programmable divider means, the clock producing a stable reference frequency signal, and the divider dividing the clock output by a modulus N, the modulus N programmable in a predetermined manner in response to a selected frequency f whereby the clock signal is divided to the frequency f at first and second outputs, the second output in predetermined phase relationship with the first.

22. The improvement of claim 14 wherein the reference generator produces the second signal in quadrature with the first.

23. The improvement of claim 14 wherein each mixing meams comprises logic means generating a first binary output responsive to the synchronous occurrence of an input singal and a reference signal, and a second binary output responsive to nonsynchronism thereof.

24. The improvement of claim 14 further comprising means counting the number of above threshold samples detected during a predetermined time period, including means producing a second tone detect signal in response to a predetermined count.

25. The improvement of claim 14 further comprising a plurality of counting means, each such means counting the number of above threshold samples detected during a predetermined time period, including means producing a second tone detect signal in response to a predetermined count.

26. The improvement of claim 14 wherein the processing means comprises a plurality of threshold detecting means, each detecting means producing a threshold detect signal in response to predetermined first and second vector components, the arrangement further comprising means to selectively activate one of the desired threshold detectors.

* * * * *